(12) United States Patent
Kumar et al.

(10) Patent No.: US 11,901,900 B2
(45) Date of Patent: Feb. 13, 2024

(54) SCHMITT TRIGGER WITH CURRENT ASSISTANCE CIRCUIT

(71) Applicant: STMicroelectronics International N.V., Geneva (CH)

(72) Inventors: Kailash Kumar, Hazaribagh (IN); Manoj Kumar, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/843,780

(22) Filed: Jun. 17, 2022

(65) Prior Publication Data
US 2022/0416768 A1 Dec. 29, 2022

Related U.S. Application Data

(60) Provisional application No. 63/214,137, filed on Jun. 23, 2021.

(51) Int. Cl.
| | | |
|---|---|---|
| *H03K 3/00* | (2006.01) | |
| *H03K 3/012* | (2006.01) | |
| *H03K 3/3565* | (2006.01) | |
| *H03K 3/2893* | (2006.01) | |

(52) U.S. Cl.
CPC ........... *H03K 3/012* (2013.01); *H03K 3/2893* (2013.01); *H03K 3/3565* (2013.01)

(58) Field of Classification Search
CPC ...... H03K 3/13; H03K 3/0377; H03K 3/3565; H03K 3/2893
See application file for complete search history.

(56) References Cited

U.S. PATENT DOCUMENTS

| | | | | |
|---|---|---|---|---|
| 5,349,246 | A * | 9/1994 | McClure | H03K 3/3565 326/121 |
| 5,594,361 | A * | 1/1997 | Campbell | H03K 3/3565 326/24 |
| 6,346,829 | B1 | 2/2002 | Coddington | |
| 6,388,487 | B1 * | 5/2002 | Hirose | H03K 3/3565 327/205 |
| 6,388,488 | B1 * | 5/2002 | Ho | H03K 3/356008 327/112 |
| 6,433,602 | B1 * | 8/2002 | Lall | H03K 3/3565 327/205 |
| 6,690,222 | B2 * | 2/2004 | Nair | H03K 3/012 327/205 |
| 6,724,226 | B2 | 4/2004 | Kim | |
| 7,521,970 | B2 | 4/2009 | Gupta et al. | |
| 9,496,874 | B2 | 11/2016 | Kim | |
| 9,673,788 | B2 * | 6/2017 | Zhao | H03K 3/012 |
| 2019/0074822 | A1 * | 3/2019 | Hiraoka | H03K 3/356086 |

* cited by examiner

*Primary Examiner* — Tuan T Lam
(74) *Attorney, Agent, or Firm* — Seed IP Law Group LLP

(57) ABSTRACT

An integrated circuit includes an input pad and a Schmitt trigger coupled to the input pad. The Schmitt trigger includes a main PMOS branch that charges an intermediate node of the Schmitt trigger responsive to voltage transitions at the input node. The Schmitt trigger includes a charging assistance circuit that helps to rapidly charge the intermediate node of the Schmitt trigger. The charging assistance circuit includes a parallel PMOS branch in parallel with the main PMOS branch.

20 Claims, 6 Drawing Sheets

SCHMITT TRIGGER WITH CURRENT ASSISTANCE CIRCUIT

BACKGROUND

Technical Field

The present disclosure is related to integrated circuits, and more particularly to input/output (I/O) circuits of integrated circuits.

Description of the Related Art

Integrated circuits typically include a data input pad. The data input pad receive signals from a circuit external to the integrated circuit. The signals can include data signals that switch between low and high values corresponding to data values of 0 and 1. The data signals that arrive at the input pad may have high values that are significantly lower than supply voltage values of the integrated circuits. Furthermore, the data signals may have significant noise or other transient properties.

In order to properly process the data signals that arrive at the input pad, integrated circuits typically include a driver circuit coupled to the input pad. The driver circuit receives the voltage at the input pad and outputs a data signal having a value corresponding to the data value of the patent. The data signal output by the driver circuit can be either ground voltage (0) or the high supply voltage (1) of the integrated circuit.

One example of an input driver circuit is a Schmitt trigger. The Schmitt trigger generally includes two inverters. The first inverter inverts the data signal from the pad. The second inverter inverts the output of the first inverter and, thus, provides an output corresponding to the data value at the pad, but at the supply voltage levels of the integrated circuit. The Schmitt trigger also includes circuitry that introduces a high threshold value and a low threshold value that help govern transitions between high and low and low and high values of the data signal at the pad. When transitioning from a low data value to a high data value, the output of the Schmitt trigger will not change from 0 to 1 unless the pad voltage exceeds the high threshold value. When transitioning from a high data value to a low data value, the output of the Schmitt trigger will not change from 1 to 0 unless the pad voltage is less than the low threshold value.

While the Schmitt trigger is a helpful input driver, there are also various difficulties associated with Schmitt triggers. For example, designing a Schmitt trigger to have low static current consumption generally results in correspondingly low switching speeds. Improving the switching speeds can result in significantly higher area consumption.

BRIEF SUMMARY

Embodiments of the present disclosure provide a Schmitt trigger with both low static current consumption and high frequency operation without high area consumption. The Schmitt trigger includes a charging assistance circuit that provides high supplemental charging currents during transitions between data values while contributing substantially no static current consumption between transitions. The charging assistance circuit accomplishes this with very little additional area consumption.

The high supplemental charging currents during transitions result in very fast operation of the Schmitt trigger. In other words, when a data value at an input pad of an integrated circuit changes, the data value output by the Schmitt trigger processes the change very rapidly with the help of the supplemental charging current provided by the charging assistance circuit. During periods of time when there is no change in the data value at the input pad, the charging assistance circuit provides substantially no static current. Thus, the Schmitt trigger has very high frequency operation and very low static current consumption.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known algorithms associated with facial recognition, facial detection, and facial authentication have not been shown or described in detail, to avoid unnecessarily obscuring descriptions of the embodiments. Further, well-known components and circuits associated with memory arrays have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
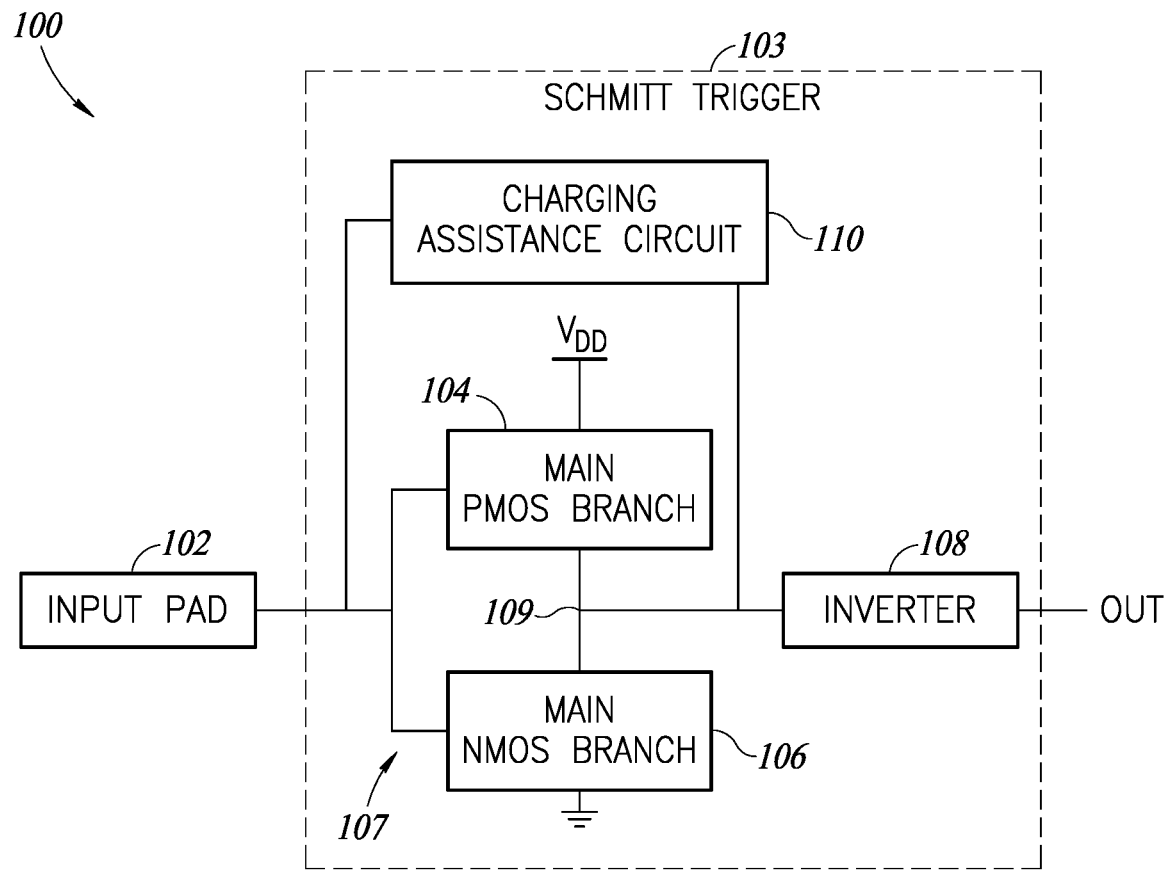
FIG. 1 is a block diagram of an integrated circuit including a Schmitt trigger, in accordance with some embodiments.

FIG. 1 is a block diagram of an integrated circuit 100, in accordance with some embodiments. The integrated circuit includes an input pad 102 and a Schmitt trigger 103. The Schmitt trigger 103 acts as an input driver for the input pad 102. As will be set forth in more detail below, the Schmitt trigger 103 provides high frequency operation with low static current consumption.

The integrated circuit 100 may include a plurality of pad. Each pad corresponds to a terminal of the integrated circuit. The integrated circuit 100 may include a semiconductor die with a plurality of transistors, dielectric layers, and metal interconnect structures. In some embodiments, the pads may each include a conductive plate positioned on the top or bottom the integrated circuit die. When the integrated circuit 100 is encapsulated in a package, wire bonds, ball bonds, or other types of connectors may be coupled to the pads.

The input pad 102 is one of the pads of the integrated circuit 100. The input pad 102 corresponds to a data input terminal of the integrated circuit 100. The input pad receives data signals from the external device. The data signals are voltage signals. The voltage value of the data signals indicates the data value associated with the data signals. A low voltage value corresponds to a data value of 0. A high voltage value corresponds to a data value 1.

In some cases, the amplitude of signals received at the input pad 102 may be widely vary. The input signals may have amplitudes lower or higher than the high supply voltage VDD of the integrated circuit 100. In other words, voltages representing a data value of 1 may be either higher or lower than the high supply voltage VDD of the integrated circuit 100. Voltages representing a data value of 0 may be lower or higher than the ground voltage of the integrated circuit 100. Furthermore, the data signals received at the input pad may have noise or other transient properties.

The Schmitt trigger 103 acts as an input driver coupled to the input pad 102. The Schmitt trigger 103 receives the data signals at the input pad 102 provides an output voltage representing the data value at the input pad 102 with either the high supply voltage VDD or ground voltage. When a data signal at the input pad 102 corresponds to a data value of 1, the Schmitt trigger 103 outputs the high supply voltage VDD corresponding to the data value of 1 at the input pad 102. When a data signal at the input pad corresponds to a data value of 0, the Schmitt trigger 103 outputs ground voltage corresponding to the data value of the real zero at the input pad 102.

The Schmitt trigger 103 includes a first main transistor branch 104 of a first conductivity type, such as a PMOS branch and a second main transistor branch 106 of a second conductivity type, such as an NMOS branch. The first and second conductivity types are different from each other. The main PMOS branch 104 and the main NMOS branch 106 are coupled together as an inverter. Accordingly, the main PMOS branch 104 and the main NMOS branch 106 can correspond to a first inverter 107 of the Schmitt trigger 103. While the disclosure and figures primarily address examples in which the first main transistor branch 104 is a PMOS transistor branch and the second main transistor branch is an NMOS transistor branch, the first and second main transistor branches 104 and 106 can have different conductivity types without departing from the scope of the present disclosure.

The main PMOS branch 104 includes one or more PMOS transistors coupled between VDD and the main NMOS branch 106. In a simplified example, the main PMOS branch 104 may include a single PMOS transistor having a source terminal coupled to VDD, a gate terminal coupled to the input pad 102, and a drain terminal coupled to the main PMOS branch 106. In practice, the main PMOS branch 104 may include two or more PMOS transistors connected in series between VDD and the main NMOS branch 106.

The main NMOS branch 106 includes one or more NMOS transistors coupled between the main PMOS branch 104 and ground. In a simplified example, the main NMOS branch 106 may include a single NMOS transistor having a source terminal coupled to ground, a gate terminal coupled to the input pad 102, a drain terminal coupled to the drain terminal of the PMOS transistor of the main PMOS branch 104. The drain terminal of the NMOS transistor and the drain terminal of the PMOS transistor correspond to the output of the first inverter 107. In practice, the main NMOS branch 106 may include two or more NMOS transistors connected in series and each having gate terminals coupled to the input pad 102.

The Schmitt trigger 103 also includes a second inverter 108. The input of the second inverter 108 is coupled to the output of the first inverter 107. The output of the second inverter 108 is the output of the Schmitt trigger 103.

In operation, a data signal having a data value is received at the input pad 102. The first inverter 107 receives the data signal and outputs a signal having a data value that is the inverse of the data value at the input pad 102. The second inverter 108 receives the data value from the first inverter 107 and inverts the data value from the first inverter 107. This output of the inverter 108 has a data value that matches the data value received at the input pad 102.

Though not shown in FIG. 1, the Schmitt trigger 103 also has a threshold circuitry that defines upper and lower threshold values. In order for the Schmitt trigger 103 to process a change from high to low at the input pad 102, the voltage at the input pad 102 must go below the low threshold value. In order for the Schmitt trigger 103 to process a change from low to high at the input pad 102, the voltage at the input pad 102 beyond the high threshold value.

In some embodiments, in order to maintain low power consumption, the main PMOS branch 104 is designed to provide very little static current consumption. Static current consumption corresponds to the current that passes through the main PMOS branch 104 while the valley at the input pad 102 is static. In the current that passes through the main PMOS branch 104 or the main NMOS branch 106 when no change at the input pad 102 is being processed is static current consumption and represents wasted power consumption.

To ensure that the static current consumption is low, the transistors of the main PMOS branch 104 may be relatively small transistors that can only provide relatively small currents. While the small currents are beneficial for ensuring low static current consumption, the small currents also result in slower transitions when a new data value appears at the input pad 102. This is because the inverter 108 will not process a change until the node 109 connecting the main PMOS branch 104, the main NMOS branch 106, and the input of the inverter 108 is charged to the new voltage. The node 109 acts as a capacitor that is charged to VDD when the input pad 102 transitions from high to low and that is discharged from VDD to ground when the input pad 102 transitions from low to high.

If the input pad 102 is initially at a high voltage value representing a data value of 1, then the node 109 is at ground voltage. If the input pad 102 transitions from a high-voltage value to a low-voltage value representing a data value of 0, then the main PMOS branch 104 is turned on and a current flows through the main PMOS branch 104 and charges the node 109 to VDD. If the input pad then transitions from the low-voltage value to a high-voltage value representing a data value of 1, then the main PMOS branch 104 is turned off and the main NMOS branch 106 is turned on and the node 109 discharges from VDD to ground through the main NMOS branch 106. Accordingly, if the main PMOS branch 104 can only supply relatively small currents, then charging of the node 109 from ground to VDD will happen relatively slowly.

In order to provide fast charging times for the node 109, the Schmitt trigger 103 includes the charging assistance circuit 110. The charging assistance circuit 110 provides a supplemental charging current to the node 109 when the main PMOS branch 104 is activated. The supplemental charging current is provided to the node 109 in addition to the charging current supplied through the main PMOS branch 104. The addition of the supplemental charging current from the charging assistance circuit 110 to the node 109 results in very fast charging times for the node 109. Very fast charging times of the node 109 correspond to very high-frequency operation of the Schmitt trigger 103.

The charging assistance circuit 110 provides substantially zero static current consumption between transitions. This is because the charging assistance circuit 110 is fully turned off after the node 109 has been charged to VDD. For reasons that will be made more clear in relation to FIG. 2, the charging assistance circuit 110 can be turned off more fully than can the transistors of the main PMOS branch 104. Thus, while the relatively small transistors of the main PMOS branch 104 may not be fully turned off when the voltage on the input pad 102 is high, charging assistance circuit 110 is fully turned off when the voltage on the input pad is high and low supplies substantially zero static current.

The present disclosure primarily describes embodiments in which the charging assistance circuit provides a supplemental charging current for transitions from high voltage values to low-voltage values at the input pad 102 (e.g. transitions from 1 to 0 at the input pad 102). This is because generally the main NMOS branch 106 can be more reliably fully shut off when the voltage at the input pad 102 is low (0), while the main PMOS branch 104 may not be as reliably shut off when the voltage at the input pad is high (1). Accordingly, the main NMOS branch 106 can be designed to carry high charging currents while maintaining substantially zero static current consumption.

Nevertheless, principles of the present disclosure can be extended to a charging assistance circuit 110 that assists the main NMOS branch 106 in discharging the node 109 from VDD to ground during transitions from 0 to 1 at the input pad 102 accordingly. Accordingly, a charging assistance circuit 110 in accordance with principles of the present disclosure can be utilized to assist the main PMOS branch 104, the main NMOS branch 106, or both the main PMOS branch 104 and the main NMOS branch 106 without departing from the scope of the present disclosure.

Figure 2:
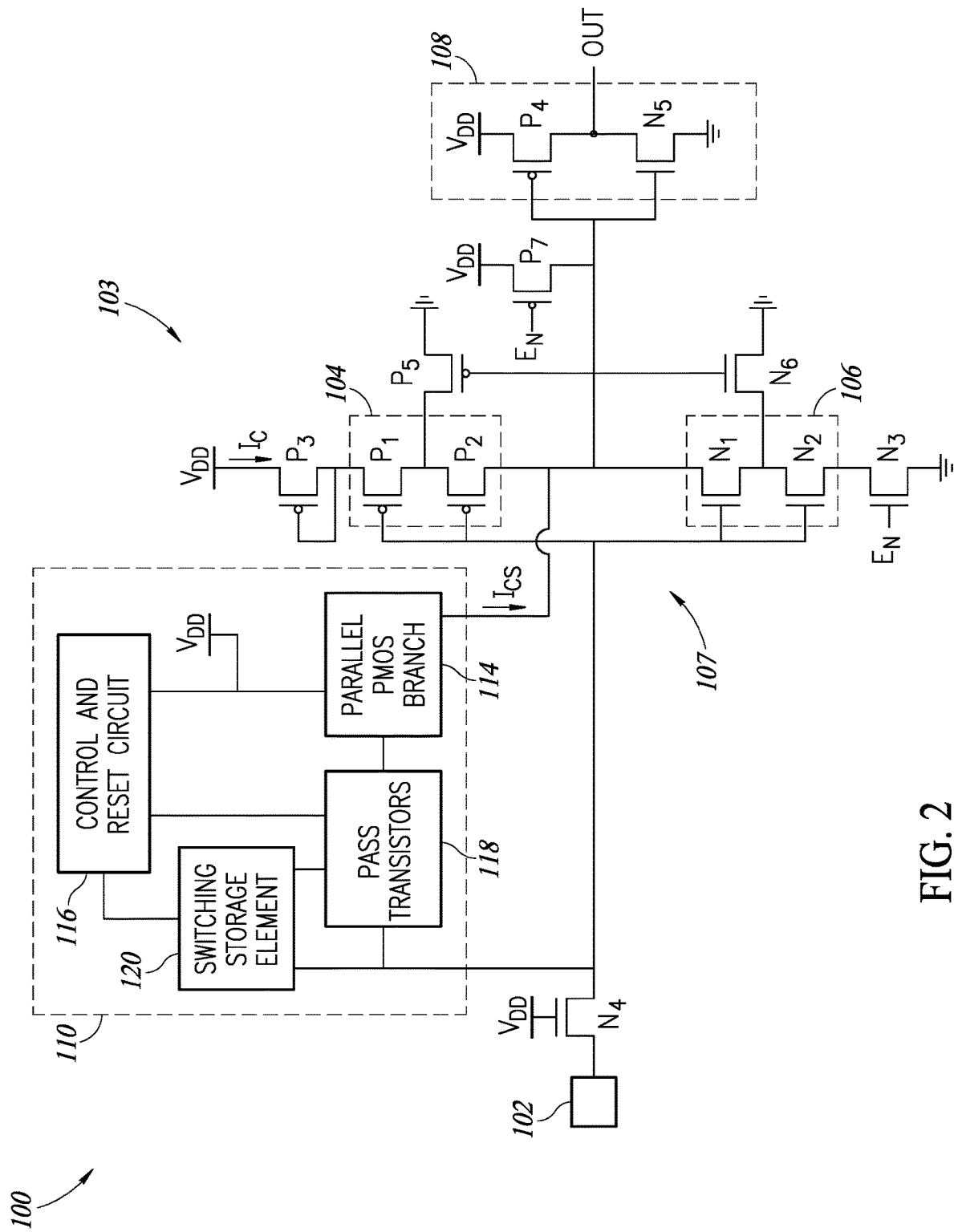
FIG. 2 is a schematic diagram of an integrated circuit including a Schmitt trigger, in accordance with some embodiments.

FIG. 2 is a schematic diagram of an integrated circuit 100 including the Schmitt trigger 103, in accordance with some embodiments. The Schmitt trigger 103 includes a charging assistance circuit 110 that improves the switching speed of the Schmitt trigger 103, as will be described in more detail below. The Schmitt trigger 103 of FIG. 2 is one example of the Schmitt trigger 103 of FIG. 1.

The Schmitt trigger 103 includes a main PMOS branch 104 and a main NMOS branch 106 coupled together as an inverter 107. The main PMOS branch 104 includes a first PMOS transistor P1 and a second PMOS transistor P2 connected in series. A third PMOS transistor P3 is coupled between the transistor P1 and VDD. The main NMOS branch 106 includes a first NMOS transistor N1 and the second NMOS transistor N2. A third NMOS transistor N3 is coupled between the transistor N2 and ground. A fourth NMOS transistor is coupled between the input pad 112 and the gate terminals of the transistors P1, P2, N1, and N2.

The gate terminals of the transistors P1, P2, N1, and N2 correspond to the input of the inverter 107. The gate terminals of the transistors P1, P2, N1, and N2 receive the input pad voltage 112 via the NMOS transistor N4. The output of the inverter 107 corresponds to the drain terminals of the transistors P2 and N1, which also corresponds to the node 109.

The inverter 108 includes a PMOS transistor P4 and an NMOS transistor N5. The gate terminals of the transistors P4 and N5 are coupled to the node 109 and receive the output of the inverter 107. The source terminal of the transistor P4 is coupled to VDD. The source terminal of the transistor N5 is coupled to ground. The output of the inverter 108 is the drain terminals of the transistors P4 and N5.

The Schmitt trigger 103 includes a PMOS transistor P5 having a source terminal coupled between the drain terminal of the transistor P1 and the source terminal of the transistor P2. The source terminal of the transistor P5 is coupled to ground. The gate terminal of the transistor P5 is coupled to the node 109. The transistor P5 has the effect of setting the high threshold value for the Schmitt trigger 103.

The Schmitt trigger 103 includes an NMOS transistor N6 having a source terminal coupled to the drain terminal of the transistor N2 and the source terminal of the transistor N1. The gate terminal of the transistor N6 is coupled to the node 109. The source terminal of the transistor N6 is coupled to ground. The transistor N6 has the effect of setting the low threshold value for the Schmitt trigger 103.

The Schmitt trigger includes a PMOS transistor P7. The source terminal of the transistor P7 is coupled to VDD. The drain terminal of the transistor P7 is coupled to the node 109. The gate terminal of the transistor P7 receives and enable signal En. When the enable signal is low, the PMOS transistor P7 couples the node 109 to VDD, thereby forcing the output of the Schmitt trigger 103 to ground. This effectively turns off the Schmitt trigger 103. When the enable signal is high, the transistor P7 is off and the Schmitt trigger 103 can operate.

The charging assistance circuit 110 includes a parallel PMOS branch 114, the control reset circuit 116, a pass transistor 118, and the switching storage element 120. The parallel PMOS branch 114 provides a supplemental charging current Ics that helps charge the node 109 to VDD when the voltage at the input pad 102 transitions from a high voltage (1) to a low-voltage (0). The parallel PMOS branch 114 supply substantially zero current after the node 109 is charged to VDD. Accordingly, the parallel PMOS branch 114 operates in parallel with the main PMOS branch 104 to charge the node 109 when the input pad 112 transitions from 1 to 0. Although FIG. 2 illustrates a single parallel PMOS branch 114, in practice, there may be multiple parallel PMOS branches 114 that each supply a supplemental charging current to the node 109 in parallel with the main PMOS branch 104.

The pass transistor 118 is coupled between the input pad 102 and the parallel PMOS branch 114. When the pass transistor 118 passes the low-voltage from the input pad 102 to the parallel PMOS branch 114, the parallel PMOS branch 114 provides the supplemental charging current Ics. The pass transistor 118 is also coupled to the switching storage element 120 and the control reset circuit 116.

The switching storage element 120 is coupled to the input pad 102, the control and reset circuit 116, and to pass transistor 118. The switching storage element 120 stores the pad voltage when the pad voltage is high. The pad voltage is not high, the switching storage element 120 stores the high supply voltage VDD. The switching storage element 120 assists in enabling the pass transistor 118 when the voltage at the input pad 112 goes low.

The control reset circuit 116 is coupled to the switching storage element 120, the pass transistor 118, and the parallel PMOS branch 114. The control reset circuit 116 includes one or more switches that enable charging and discharging of the switching storage element 120. The control reset circuit 116 can include one or more switches to pull of gate voltages of the parallel PMOS branch 114 to the supply voltage VDD in order to prevent any current from flowing from the parallel PMOS branch 114. The control reset circuit 116 is configured to reset the gate voltage of the pass transistor 118 when the voltage on the input pad 102 goes low. This ensures that the pass transistor 118 turns on the next time the voltage at the input pad 102 goes low.

Figure 3:
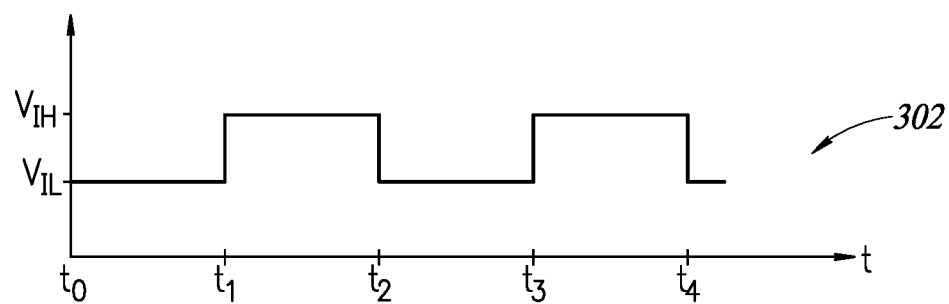
FIG. 3 includes a plurality of graphs of voltages and currents associated with the Schmitt trigger of FIG. 2, in accordance with some embodiments.
Figure 3:
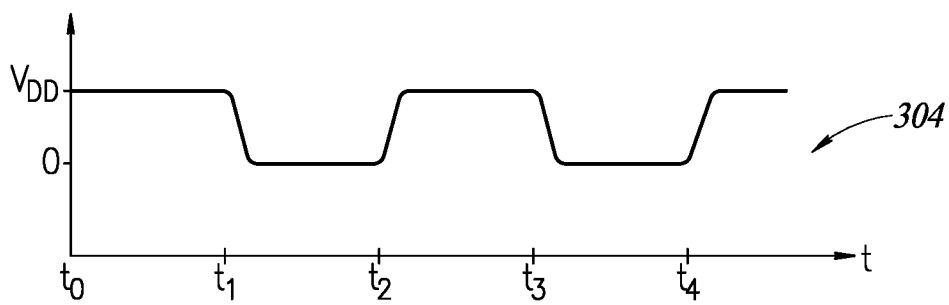
Figure 3:
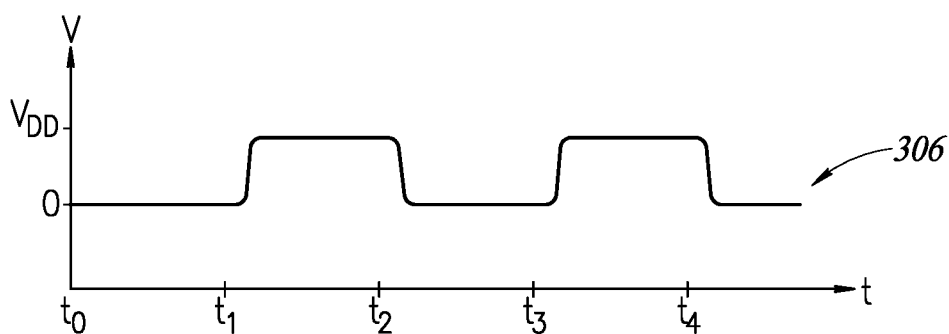
Figure 3:
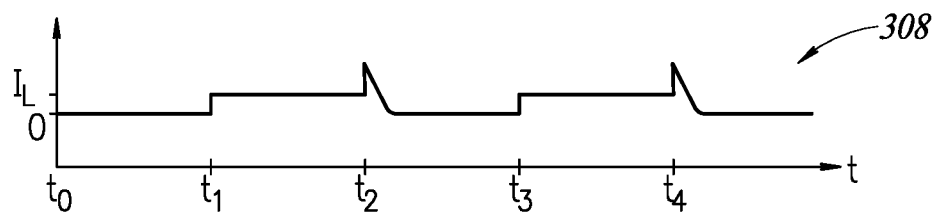
Figure 3:
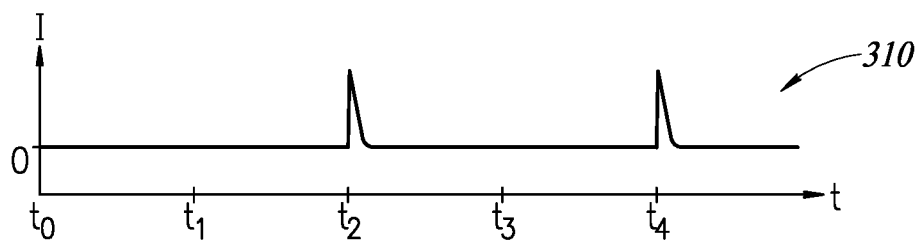

The functionality of the Schmitt trigger 103 of FIG. 2 will be described with reference to both FIG. 2 and FIG. 3. FIG. 3 illustrates a plurality of graphs. The graph 302 corresponds to the voltage at the input pad 102 as a function of time. The graph 304 corresponds to the voltage at the node 109 as a function of time. The graph 306 corresponds to the output voltage of the Schmitt trigger 103 is a function of time. The graph 308 corresponds to the charging current Ic current flowing through the main PMOS branch 104 as a function of time. The graph 310 corresponds to the supplemental charging current Ics flowing charging assistance circuit 110 is a function of time.

At time T0 the voltage at the input pad 112 is low, as indicated in the graph 302. At time T0, the voltage at the node 109 is at VDD because the inverter 107 inverts the value of data at the input pad 102, as indicated by the graph 304. At time T0, the output of the Schmitt trigger 103 is ground, representing the data value of 0 present at the input pad 102 as indicated by the graph 306. At time T0 the charging current flowing through the PMOS branch 104 is a small nonzero value IL as indicated in the graph 308. At time T0 the supplemental charging current is substantially zero as indicated by the graph 310.

At time T1, the value of the data signal at the input pad 102 changes from 0 to 1. When the value of the data signal at the input pad 102 changes from 0 to 1, the voltage of the node 109 transitions from VDD to ground as can be seen in the graph 304. Due to the large capacitance of the node 109, the transition is not as sharp as the change in voltage at the node 102. Nevertheless, the transition happens relatively quickly. Shortly after time T1, the output of the Schmitt trigger transitions from ground to VDD. The delay in this transition is to the fact that the transmission of the output signal happens responsive to the transition that the node 109. The charging current of the supplemental charging current remain at the values IL and 0, respectively, between times T1 and T2.

At time T2, the voltage at the input pad transitions from 1 to 0. This causes the charging current to flow from the main PMOS branch 104 to the node 109. This also causes the supplemental charging current to flow from the parallel PMOS branch 114 to the node 109. The spikes in the charging current and the supplemental charging current at time T2 represents charging of the node 109 from ground to VDD. Once the node 109 has reached VDD, the charging current and the supplemental charging current returned to the leakage level and zero, respectively. Because the supplemental charging current flows at time T2, the charging of the node 109 from 0 V to VDD happens very quickly. The output of the Schmitt trigger 103 transitions from 1 (VDD) to 0 (ground) shortly after the node 109 transitions from ground to VDD. Between times T2 and T4, the process repeats itself. While FIG. 302 illustrates the voltage at the input pad 102 as a square wave, in practice, the voltage of the input pad 102 is not a square wave but may transition between low and high values within irregular period.

The transistor P3 of the Schmitt trigger 103 helps to reduce static consumption currents flowing through the main PMOS branch 104. The transistor P3 is connected as a diode with the drain and gate terminals coupled together. This results in the voltage drop of about 0.7 V across the transistor P3. The voltage at the drain terminal of the transistor P1 is therefore VDD−0.7. When the voltage at the node 109 is 0 V, the static consumption current flows through the main PMOS branch 104. The voltage drop across the transistor P3 reduces the magnitude of the static consumption current. There may be multiple diode connected PMOS transistors between the high supply voltage VDD and the main PMOS branch 104.

Figure 4:
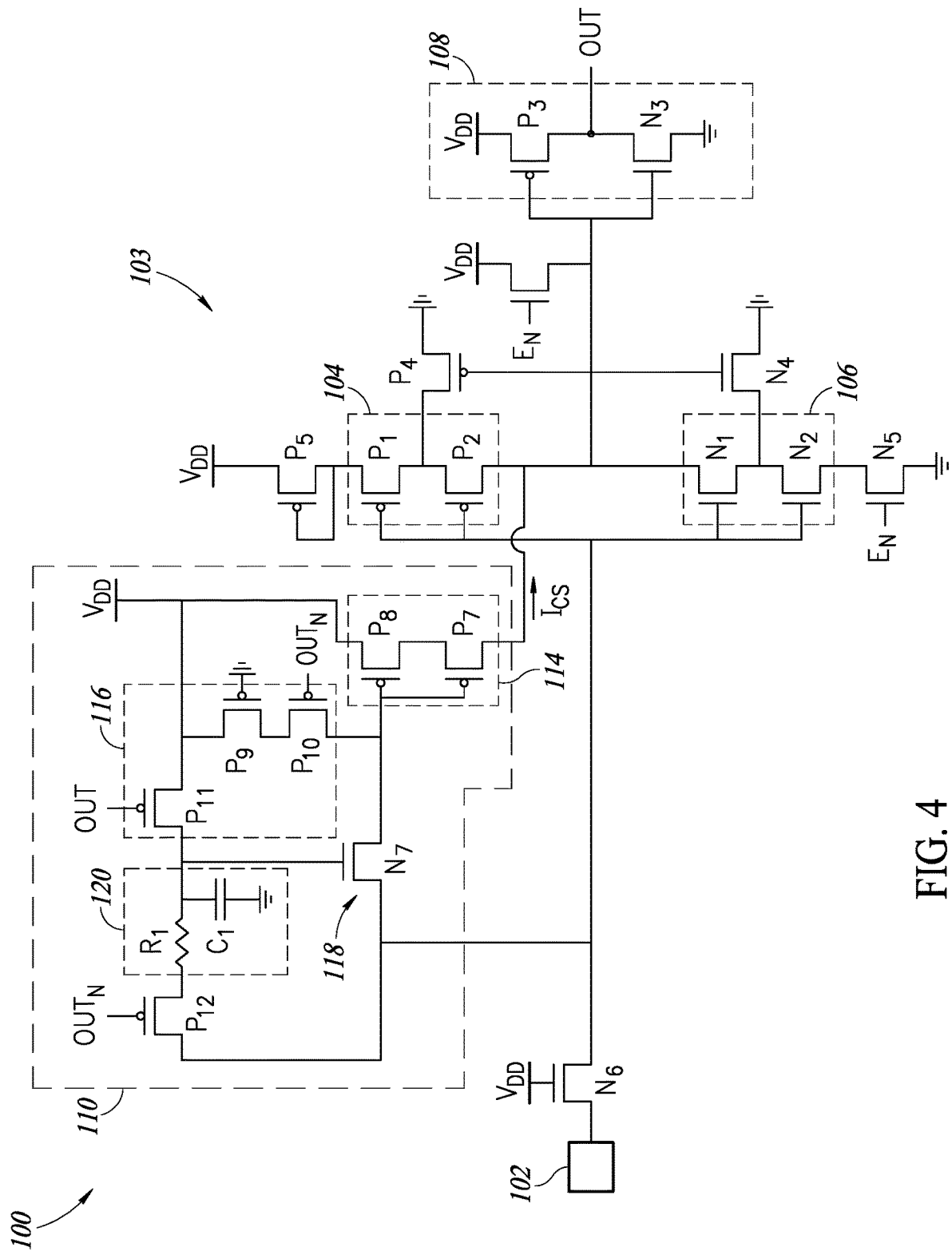
FIG. 4 is a schematic diagram of an integrated circuit including a Schmitt trigger, in accordance with some embodiments.

FIG. 4 is an illustration of an integrated circuit 100 including a Schmitt trigger 103, in accordance with some embodiments. The only difference between FIG. 2 and FIG. 4 is the charging assistance circuit 110. FIG. 4 includes a schematic diagram of a charging assistance circuit 110. The charging assistance circuit 110 of FIG. 4 is one example of the charging assistance circuits 110 of FIGS. 1 and 2.

The parallel PMOS branch 114 includes PMOS transistors P7 and P8. The past transistor 118 includes the NMOS transistor N7. The switching storage element 120 includes a resistor R1 and a capacitor C1. The control and reset circuit 116 includes PMOS transistors P9, P10, P11, and P12. The gate terminals of the transistors P7 and P8 are coupled to the drain terminal of the past transistor N7. The source terminal of the transistor P8 is coupled to the high supply voltage VDD. The drain terminal of the transistor P7 is connected to the node 109. The supplemental charging current Ics flows through the transistors P8 and P7 to the node 109. The gate terminals of the transistors P7 and P8 are also coupled to the drain terminal of the transistor P 10. The drain terminal of the transistor P 10 receives the signal OUTn corresponding to the logical complement of the output OUT of the Schmitt trigger 103. The gate terminal of the transistor P9 receives ground. The gate terminal of the transistor P 11 receives the output voltage of the Schmitt trigger 103. The gate terminal of the transistor P 12 receives the complementary output signal OUTn.

With reference again to the timing and signals illustrated in FIG. 3, at time T0, the voltage on the input pad 102 is the low input value, the output voltage OUT is ground, and the complementary output OUTn is VDD. The transistor P 12 is off and the transistor P 11 is on. The capacitor C1 charges to VDD. The gate terminal of the transistor N7 receives VDD. The transistor P9 is always on. The transistor P 10 is off. The transistors P7 and P8 receive the low input voltage from the input pad 102 via the pass transistor 102. As the node 109 is already charged to VDD, no current flows through the transistors P7 and P8.

At time T1, the voltage on the input pad 102 goes to the high input voltage. The transistors N1 and N2 are enabled, discharging the node 109 to ground. The output voltage OUT transitions to VDD. The complementary output voltage OUTn transitions to ground. The transistor P 12 is turned on and the transistor P 11 is turned off. The capacitor C1 charges to the high input voltage of the input pad 102. The transistors P9 and P 10 are on, thereby supplying VDD to the gate terminals of the transistors P7 and P8 and fully turning them off such that no supplemental charging current flows. The transistor N7 is off because the gate and source terminals are both at the high input voltage of the input pad 102.

At time T2, the input pad transitions from the high input voltage to the low input voltage. This immediately turns on the pass transistor N7 because the gate terminal of the pass transistor N7 is still at the high input voltage due to the charge stored in the capacitor C1. Because the past transistor and seven immediately turns on, the gate terminals of the transistors P7 and P8 immediately receive the low input voltage of the input pad 102 and are not. The transistors P7 and P8 supply the supplemental charging current Ics to the node 109 and quickly charge the node 109 to VDD. After the dove 109 charges to VDD, the output OUT transitions to ground. OUTn transitions to VDD. The transistor P 12 is turned off and the transistor P 11 is turned on, charging the capacitor C1 to VDD. The charging assistance circuit 110 is, thus, reset to the state that it was time T0.

The charging assistance circuit 110 provides several benefits. The supplemental charging current is enabled substantially immediately upon a transition of the input pad 102 from the high input voltage to the low input voltage. The supplemental charging current Ics rapidly charges the node 109 to VDD. When the input pad one transitions from the low input voltage to the high input voltage, the transistors P7 and P8 are immediately and fully turned off such that the supplemental charging current Ics is substantially zero. Thus, the charging assistance circuit 110 enables very high-frequency operation of the Schmitt trigger 103 with no additional staff current consumption and very little area usage.

Figure 5:
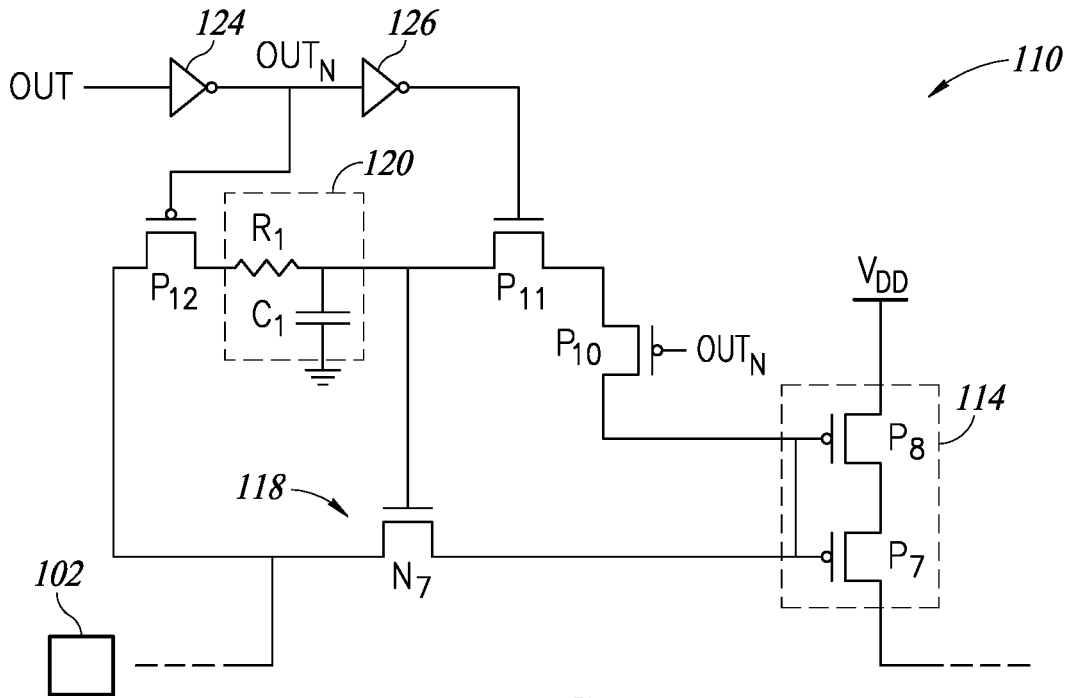
FIG. 5 is a schematic diagram of a charging assistance circuit of the Schmitt trigger, in accordance with some embodiments.

FIG. 5 is a schematic diagram of a charging assistance circuit 110, in accordance with some embodiments. The charging assistance circuit 110 of FIG. 5 is one example of a charging assistance circuit 110 of FIGS. 1 and 2. The charging assistance circuit 110 of FIG. 5 shares many components of the charging assistance circuit 110 of FIG. 4. The charging assistance circuit 110 of FIG. 5 includes an inverter 124 and an inverter 126. The inverter 124 receives the output signal Out and generates the complementary output signal OUTn. The complementary output signal OUTn is applied to the gate terminals of the transistors P12 and P10. The inverter 126 receives the complementary output signal OUTn and generates a signal that matches the output signal OUT. The charging assistance circuit 110 operates in substantially the same manner as the charging assistance circuit 110 of FIG. 4.

Figure 6:
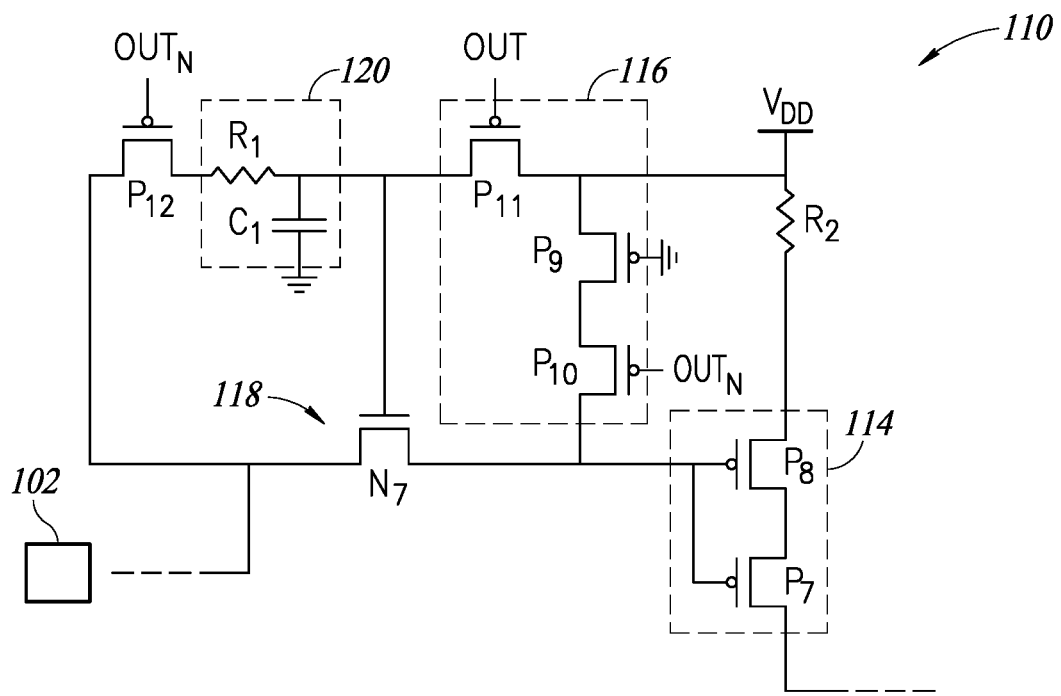
FIG. 6 is a schematic diagram of a charging assistance circuit of the Schmitt trigger, in accordance with some embodiments.

FIG. 6 is a schematic diagram of a charging assistance circuit 110, in accordance with some embodiments. The charging assistance circuit 106 of FIG. 6 is one example of the charging assistance circuits of FIGS. 1 and 2. The charging assistance circuit is substantially similar to the charging assistance circuit 106 of FIG. 4. The primary difference is that in FIG. 6, a second resistor R2 is coupled between VDD and the source terminal of the transistor P8.

The presence of the resistor R2 can help stabilize operation of the Pearl PMOS branch 114. In particular, the presence of the resistor R2 can reduce the effect of variation in the supply voltage VDD. The charging assistance circuit 110 of FIG. 6 otherwise operates substantially similar to the charging assistance circuit 110 of FIG. 4.

Figure 7:
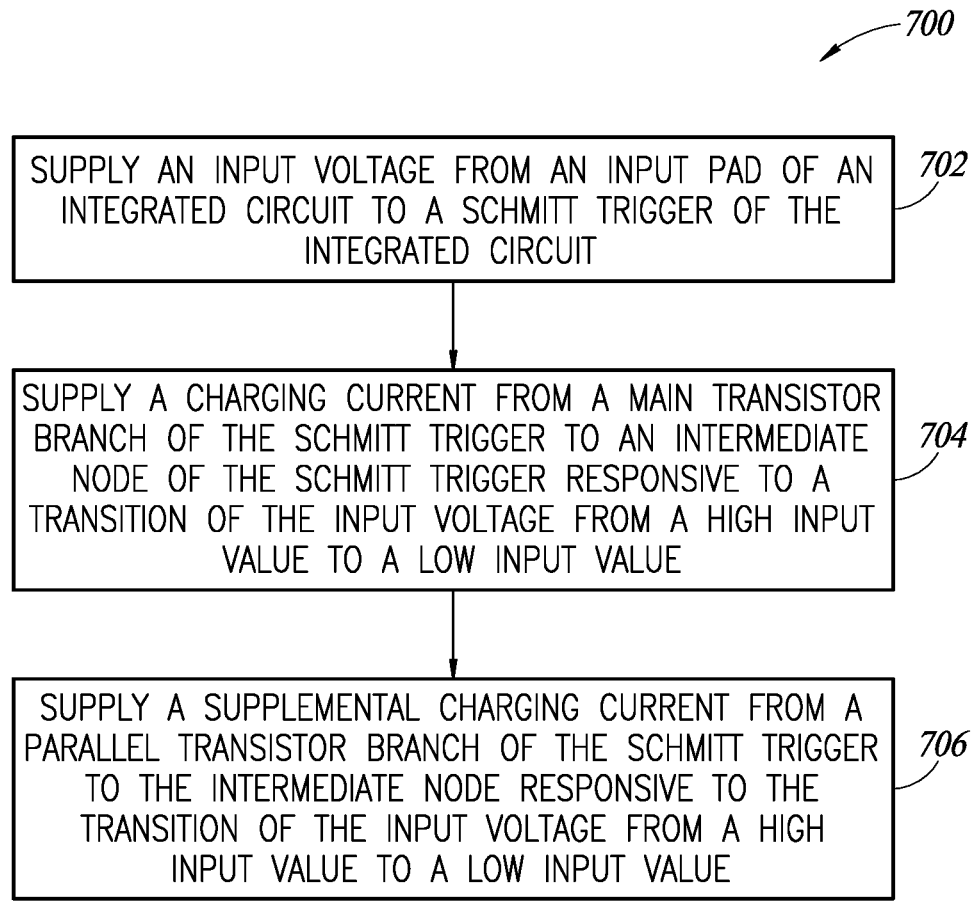
FIG. 7 is a flow diagram of a method for operating a Schmitt trigger, in accordance with some embodiments.

FIG. 7 is flow diagram of a method 700 for operating a Schmitt trigger, in accordance with some embodiments. At 702, the method 700 includes supplying an input voltage from an input pad of an integrated circuit to a Schmitt trigger of the integrated circuit. At 704, the method 700 includes supplying a charging current from a first main transistor branch of the Schmitt trigger to an intermediate node of the Schmitt trigger responsive to a transition of the input voltage from a high input value to a low input value. At 706, the method 700 includes supplying a supplemental charging current from a parallel transistor branch of the Schmitt trigger to the intermediate node responsive to the transition of the input voltage from a high input value to a low input value.

In one embodiment, a method includes supplying an input voltage from an input pad of an integrated circuit to a Schmitt trigger of the integrated circuit. The method includes supplying a charging current from a main transistor branch of the Schmitt trigger to an intermediate node of the Schmitt trigger responsive to a transition of the input voltage from a high input value to a low input value. The method includes supplying a supplemental charging current from a parallel transistor branch of the Schmitt trigger to the intermediate node responsive to the transition of the input voltage from a high input value to a low input value.

In one embodiment, an integrated circuit includes an input pad and a Schmitt trigger. The Schmitt trigger includes input coupled to the input pad, a first main transistor branch of a first conductivity type coupled between a high supply voltage and an intermediate node, a charging assistance circuit including a parallel transistor branch coupled between the supply voltage and the intermediate node, and a second main transistor branch of a second conductivity type opposite the first conductivity type coupled between the intermediate node and ground.

In one embodiment, an integrated circuit includes an input pad and a Schmitt trigger coupled to the input pad. The Schmitt trigger includes a first inverter having a main transistor branch including a first transistor of a first conductivity type. The Schmitt trigger includes a second main transistor branch including a second transistor of a second conductivity type coupled to the first PMOS transistor at an intermediate node of the Schmitt trigger. The Schmitt trigger includes a second inverter having an input coupled to the intermediate node an output corresponding to an output of the Schmitt trigger. The Schmitt trigger includes a charging assistance circuit coupled to the intermediate node.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, including:
an input pad; and
a Schmitt trigger including:

an input coupled to the input pad;
a first main transistor branch coupled between a high supply voltage and an intermediate node;
a charging assistance circuit including:
   a parallel transistor branch of a first conductivity type coupled between the high supply voltage and the intermediate node;
   pass transistor coupled between the input pad and the parallel transistor branch;
   a switching storage element coupled to a gate terminal of the pass transistor; and
   a control and reset circuit coupled to the switching storage element, the pass transistor, and the parallel transistor branch; and
a second main transistor branch coupled between the intermediate node and ground.

2. The integrated circuit of claim 1, wherein the Schmitt trigger includes a first inverter having an input coupled to the intermediate node and an output corresponding to an output of the Schmitt trigger.

3. The integrated circuit of claim 1, wherein the first main transistor branch and the second main transistor branch are a second inverter, wherein the input of the second inverter is the input of the Schmitt trigger, wherein the output of the second inverter is the intermediate node.

4. The integrated circuit of claim 1, wherein the first main transistor branch supplies a charging current that charges the intermediate node from ground to the high supply voltage responsive to a transition of the input pad from a high input voltage to a low input voltage.

5. The integrated circuit of claim 4, wherein the parallel transistor branch supplies a supplemental charging current that helps charge the intermediate node from ground to the high supply voltage responsive to the transition of the input pad from a high input voltage to a low input voltage.

6. The integrated circuit of claim 1, wherein the first main transistor branch is a PMOS transistor branch and the parallel transistor branch is a parallel PMOS transistor branch.

7. The integrated circuit of claim 6, wherein the main transistor branch includes a first PMOS transistor and a second PMOS transistor coupled together in series.

8. The integrated circuit of claim 7, wherein the parallel PMOS transistor branch includes a third PMOS transistor and a fourth PMOS transistor coupled together in series.

9. A method, comprising:
supplying an input voltage from an input pad of an integrated circuit to a Schmitt trigger of the integrated circuit;
supplying a charging current from a main transistor branch of the Schmitt trigger to an intermediate node of the Schmitt trigger responsive to a transition of the input voltage from a high input value to a low input value; and
supplying a supplemental charging current from a parallel transistor branch of the Schmitt trigger to the intermediate node responsive to the transition of the input voltage from a high input value to a low input value, wherein a pass transistor is coupled between the input pad and the parallel transistor branch, a switching storage element is coupled to a gate terminal of the pass transistor, and a control and reset circuit is coupled to the switching storage element, the pass transistor, and the parallel transistor branch.

10. The method of claim 9, wherein the main transistor branch is a PMOS transistor branch, wherein the parallel transistor branch is a parallel PMOS transistor branch.

11. The method of claim 10, further comprising charging the intermediate node from ground to a high supply voltage by supplying the charging current and the supplemental charging current.

12. The method of claim 11, wherein the supplemental charging current is greater than the charging current when charging the intermediate node to the high supply voltage.

13. The method of claim 12, wherein the supplemental charging current is less than the charging current when the input voltage is at the high input value.

14. The method of claim 13, wherein the supplemental charging current is substantially zero when the input voltage is at the high input value.

15. The method of claim 14, further comprising turning on a PMOS transistor of the parallel PMOS transistor branch responsive to the transition.

16. The method of claim 10, further comprising generating an output of the Schmitt trigger by inverting a voltage of the intermediate node.

17. An integrated circuit, comprising:
an input pad;
a Schmitt trigger coupled to the input pad and including:
   a first inverter having:
      a first main transistor branch including a first transistor of a first conductivity type; and
      a second main transistor branch including a second transistor of a second conductivity type opposite of the first conductivity type coupled to the first transistor at an intermediate node of the Schmitt trigger;
   a second inverter having:
      an input coupled to the intermediate node; and
      an output corresponding to an output of the Schmitt trigger; and
   a charging assistance circuit coupled to the intermediate node and including:
      a parallel transistor branch of the first conductivity type coupled between a supply voltage and the intermediate node;
      a pass transistor coupled between the input pad and the parallel transistor branch;
      a switching storage element coupled to a gate terminal of the pass transistor; and
      a control and reset circuit coupled to the switching storage element, the pass transistor, and the parallel transistor branch.

18. The integrated circuit of claim 17, wherein the charging assistance circuit includes a third transistor of the first conductivity type coupled to the intermediate node in parallel with the first transistor.

19. The integrated circuit of claim 18, wherein the first transistor supplies a charging current to the intermediate node, wherein the third transistor supplies a supplemental charging current to the intermediate node.

20. The integrated circuit of claim 17, wherein the first transistor is a PMOS transistor and the second transistor is an NMOS transistor.

* * * * *

UNITED STATES PATENT AND TRADEMARK OFFICE
CERTIFICATE OF CORRECTION

PATENT NO. : 11,901,900 B2
APPLICATION NO. : 17/843780
DATED : February 13, 2024
INVENTOR(S) : Kailash Kumar et al.

It is certified that error appears in the above-identified patent and that said Letters Patent is hereby corrected as shown below:

In the Claims

Column 11, Claim 1, Line 8:
"pass transistor" should be: --a pass transistor--.

Signed and Sealed this
Fifteenth Day of October, 2024

Katherine Kelly Vidal
*Director of the United States Patent and Trademark Office*